US007189490B2

(12) United States Patent
Kanagasabapathy et al.

(10) Patent No.: US 7,189,490 B2
(45) Date of Patent: Mar. 13, 2007

(54) PHOTORESISTS CONTAINING SULFONAMIDE COMPONENT

(75) Inventors: Subbareddy Kanagasabapathy, Worcester, MA (US); George G. Barclay, Jefferson, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/690,835

(22) Filed: Oct. 21, 2003

(65) Prior Publication Data

US 2004/0161698 A1    Aug. 19, 2004

Related U.S. Application Data

(60) Provisional application No. 60/420,056, filed on Oct. 21, 2002.

(51) Int. Cl.
| | | |
|---|---|---|
| G03C 1/73 | (2006.01) | |
| G03F 7/039 | (2006.01) | |
| G03F 7/20 | (2006.01) | |
| G03F 7/30 | (2006.01) | |
| G03F 7/36 | (2006.01) | |

(52) U.S. Cl. .................. 430/270.1; 430/326; 430/905; 430/311

(58) Field of Classification Search ............. 430/270.1, 430/325, 326, 905, 907, 910, 271.1, 311
See application file for complete search history.

(56) References Cited

U.S. PATENT DOCUMENTS

| | | | |
|---|---|---|---|
| 3,969,543 A | 7/1976 | Roberts et al. ................. 427/54 |
| 4,745,169 A | 5/1988 | Sugiyama et al. ............. 528/43 |
| 5,100,503 A | 3/1992 | Allman et al. ............... 156/643 |
| 5,240,813 A | 8/1993 | Watanabe et al. ........... 430/280 |
| 5,547,808 A | 8/1996 | Watanabe .................... 430/176 |
| 5,612,170 A | 3/1997 | Takemura et al. ........ 430/270.1 |
| 5,691,396 A | 11/1997 | Takemura et al. ............. 522/62 |
| 5,731,126 A | 3/1998 | Takemura et al. ........ 430/270.1 |
| 5,759,755 A * | 6/1998 | Park et al. .................... 430/512 |
| 5,882,844 A | 3/1999 | Tsuchiya et al. ........... 430/288.1 |
| 5,972,560 A | 10/1999 | Kaneko et al. ........... 430/270.1 |
| 6,087,064 A | 7/2000 | Lin et al. .................. 430/270.1 |
| 6,210,856 B1 * | 4/2001 | Lin et al. .................. 430/270.1 |
| 6,309,796 B1 | 10/2001 | Nakashima et al. ...... 430/287.1 |
| 6,342,562 B1 | 1/2002 | Kozawa et al. ............. 524/588 |
| 6,420,084 B1 | 7/2002 | Angelopoulos et al. .. 430/270.1 |
| 6,420,088 B1 | 7/2002 | Angelopoulos et al. .. 430/272.1 |
| 6,420,503 B1 | 7/2002 | Jayaraman et al. ......... 526/257 |
| 2003/0235785 A1 * | 12/2003 | Barclay et al. ........... 430/271.1 |

FOREIGN PATENT DOCUMENTS

| | | | |
|---|---|---|---|
| EP | 0 814 381 A1 | * | 12/1997 |
| JP | 6-59458 | * | 3/1994 |
| JP | 11-327145 | * | 11/1999 |
| JP | 2001-201855 | * | 7/2001 |
| WO | WO 00/46267 | | 8/2000 |
| WO | WO 02/091083 A1 | | 11/2002 |

OTHER PUBLICATIONS

DERWENT English abstract for JP 11-327145.*
Machine-Assisted English translation for JP 11-327145 (provided by Japan Patent Office).*
DERWENT English abstract for JP 2001-201855.*
Machine-Assisted English translation for JP 2001-201855 (provided by Japan Patent Office).*
Machine-assisted English translation for JP 6-59458, provided by JPO.*

* cited by examiner

Primary Examiner—Sin Lee
(74) Attorney, Agent, or Firm—Peter F. Corless; Darryl P. Frickey; Edwards Angell Palmer & Dodge

(57) ABSTRACT

Photoresist compositions that contain one or more components having sulfonamide and Si substitution. Preferred photoresist compositions of the invention contain an Si-polymer such as a silsesquioxane that has sulfonamide substitution and may be employed in multilayer resist systems. In preferred aspects, the Si-polymer has both sulfonamide substitution as well as moieties that can provide contrast upon exposure to photogenerated acid.

5 Claims, No Drawings

PHOTORESISTS CONTAINING SULFONAMIDE COMPONENT

The present application claims the benefit of U.S. provisional application No. 60/420,056, filed Oct. 21, 2002, which is incorporated herein by reference in its entirety.

BACKGROUND

1. Field of the Invention

The present invention relates generally to photoimageable compositions that comprise an organosilicon component and a sulfonamide component. In preferred aspects, photoresists are provided that comprise a Si-containing polymer that has sulfonamide substitution and are employed in multilayer resist systems.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

The increasing density of integrated circuits has created a need for higher resolution patterning capabilities. One method of improving resolution involves using a shorter wavelength light during pattern formation. Shorter wavelengths of approximately 200 to 280 nm may be obtained by using a deep UV ("DUV") source such as a mercury/xenon ("Hg/Xe") lamp with appropriate filters. Additionally, KrF (248 nm) or ArF (193 nm) excimer lasers may be used as exposure sources.

In addition to using shorter wavelengths during exposure, it is also desirable to use a thinner layer of resist. However, the major drawback of using a thin layer of resist is that the variation of resist thickness over a diffusion step on a substrate and into an etched pattern increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To attempt to improve dimensional control, bilayer (or bilevel or multilevel) resist systems have been utilized. In a typical bilevel system, a bottom resist is first applied to a substrate to planarize wafer topography. The bottom resist is cured and a second thinner imaging top resist is then applied over the bottom resist. The top resist is then soft baked, and patterned (or imaged) using conventional resist exposure and development, followed by etch transfer of the top pattern through the bottom resist using the top resist pattern as an etch mask. Positive resists are commonly used in bilayer applications and are typically based on novolac resins, which are condensation polymers of phenols or substituted phenols and formaldehyde. See, generally, Sugiyama et al., *Positive Excimer Laser Resists Prepared with Aliphatic Diazoketones, Soc. Plastics Eng., Conference Proceedings*, pages 51–60 (November 1988); and U.S. Pat. Nos. 4,745,169; 5,338,818; 5,619,396; 5,731,126; 6,296,985; and 6,340,734.

While such multilayer photoresists have been useful in many applications, current silicon-based resists also have exhibited some notable shortcomings, particularly in higher performance applications, e.g. where highly resolved small features (e.g. sub-quarter micron lines) are required, typically using short wavelength exposures such as 248 m or 193 nm.

Synthesis of certain norbornene groups having sulfonamide substitution have been reported in WO 00/46267 and U.S. Pat. No. 6,420,503. Specific use of the resulting norbornene materials is not disclosed in WO 00/46267 and U.S. Pat. No. 6,420,503. See also Angelo et al. in IBM Technical Disclosure Bulletin, vol. 11, no. 7 December 1968); European Patent Application EP 0731388A2; Neenan et al., Microelectronic Technology, ACS Symposium Series 614 (Apr. 2–6 1995) 194–206.

It thus would be desirable to have new materials for use in photoresist compositions. It also would be desirable to have improved photoresists for use in high performance applications such as to form small, highly resolved features. It would be particularly desirable to have new multilayer photoresist systems.

SUMMARY OF THE INVENTION

We have now provide new multilayer photoresist compositions that contain one or more components that have sulfonamide substitution. The one or more sulfonamide components suitably may be polymeric or non-polymeric.

Preferably, photoresist compositions of the invention contain a component that has Si-substitution, such as an Si-polymer and may be employed in a multilayer resist systems. The Si-component is generally organic, i.e. has both carbon and Si atoms. Suitably, the Si-component also has sulfonamide substitution, although a resist may comprise separate sulfonamide and Si components, e.g. separate (distinct or non-covalently linked) polymers where one polymer comprises one or more Si atoms (such as a silsesquioxane) but no sulfonamide substitution and a second distinct polymer that has sulfonamide substitution (e.g. repeat units with pendant sulfonamide moieties).

We have found that photoresists of the invention that contain component(s) that have both Si and sulfonamide substitution can provide enhanced lithographic performance, including enhanced resolution of a patterned resist relief image and enhanced dissolution differentials (contrast) between exposed and unexposed regions of a resist coating layer upon treatment with an aqueous alkaline developer.

Preferably, Si-polymers are employed that have sulfonamide substitution, such as pendant sulfonamide moieties.

Sulfonamide moieties of resist components and polymers of the invention suitably may correspond to the formula $(R^1)N(R)S(O)_2(R^2)$ where $R^1$ is linker group such as a chemical bond or an optionally substituted alkylene, optionally substituted heteroalkylene and the like to provide linkage to the sulfonamide component or polymer, or $R^1$ is a terminating group such as hydrogen or non-hydrogen group such as optionally substituted alkyl (e.g. $C_{1-6}$alkyl or $C_{1-6}$haloalkyl e.g. fluorinated groups such as —$CH_2F$, —$CHF_2$, —$CF_3$, —$CH_2CF_3$, —$CF_2CF_3$, and the like), optionally substituted heteroalkyl, optionally substituted aryl(carbocyclic aryl or heteroaryl), optionally substituted araalkyl, and the like; $R^2$ may be defined the same as specified above for $R^1$; and R is hydrogen or a non-hydrogen group such as optionally substituted alkyl (e.g. $C_{1-6}$-alkyl or $C_{1-6}$-haloalkyl e.g. —$CF_3$), optionally substituted heteroalkyl, optionally substituted aryl(carbocyclic aryl or heteroaryl), optionally substituted araalkyl, and the like. In certain preferred aspects, $R^1$ will be a linker and $R^2$ will not be a linker. It may be preferred that R is hydrogen. It also may be preferred that one or both of $R^1$ and $R^2$ is an electronegative substituent, such as a group substituted by one or more halo, nitro, cyano, sulfinyl, sulfonyl, and the like, with halo such as fluoro being particularly suitable.

A sulfonamide component or polymer may suitably comprise additional functional groups, such as photoacid-labile moieties i.e. moieties (such acetals or esters) that undergo reaction to provide a more polar group (e.g. carboxy or hydroxy) upon exposure to photogenerated acid, or groups that can undergo crosslinking in the presence of photogenerated acid.

Preferred polymers of the invention also may contain units that are free of photoacid-labile groups and/or aqueous-solubilizing groups, e.g. groups that are free of photoacid-labile ester or acetal moieties, or hydroxy, carboxy or sulfonic acid moieties. Preferred repeat units of this type include carbocyclic aryl (e.g. phenyl or naphthyl) or alkyl (inclusive of alkylidene and other branched groups) groups that are not substituted with such photoacid-labile or aqueous, alkaline solubilizing moieties, e.g. alkyl, phenyl or naphthyl groups that are either unsubstituted or substituted by one or more halo, unsubstituted alky, non-photoacid labile alkoxy, mesyl or other sulfonic esters such as those of the formula $C_{1-8}$alkyl$SO_3$-and the like.

Particularly preferred substituted sulfonamide moieties of components and polymers of the invention include those of the following formulae (I):

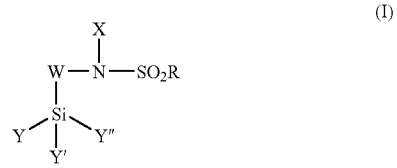

(I)

wherein Y, Y' and Y''' are each independently a chemical bond to another polymer, hydrogen or a non-hydrogen substituent such as hydroxy, optionally substituted $C_{1-20}$alkyl(includes cycloalkyl such as norbornyl or adamantyl), optionally substituted carbocyclic aryl such as optionally substituted phenyl or naphthyl and the like;

each W is a linker, e.g. a chemical bond, an optionally substituted carbocyclic aryl such as optionally substituted phenyl, naphthyl or anthracene, an optionally substituted alkyl such as optionally substituted $C_{1-20}$alkyl(includes cycloalkyl such as norbornyl or adamantyl), and the like;

R is a non-hydrogen substituent such as optionally substituted alkyl, particularly halogenated alkyl e.g. $C_{1-20}$alkyl (includes cycloalkyl such as norbornyl or adamantyl) that has one or more halogen atoms such as fluorine e.g. —$CH_2F$, —$CHF_2$, —$CF_3$, —$CH_2CH_2F$, —$CH_2CF_3$, and the like, or an option ally substituted carbocyclic aryl such as optionally substituted phenyl or naphthyl, and the like; and X is hydrogen or a non-hydrogen substituent such as $C_{1-20}$alkyl(includes cycloalkyl) particularly methyl or ethyl, optionally substituted carbocyclic aryl such as optionally substituted phenyl.

Preferably, a sulfonamide is not directly covalently bonded to an Si atom, but rather one or more other atoms are interposed therebetween.

As mentioned, polymers of the invention are particularly useful as a resin component of a photoresist composition. Typical photoresist compositions of the invention will contain a photoactive component, e.g. one or more photoacid generator compounds. Chemically-amplified positive-acting photoresists will contain a component that preferably has one or more photoacid-labile deblocking groups. Such photoacid-labile group(s) suitably will be substituents of the silicon-containing resin, but the resist also may contain a separate component such as a separate oligomer or polymer that contains such photoacid-labile group(s). Negative-acting resists of the invention typically will contain an agent for crosslinking of one or more of the components of the resist, typically a separate crosslinker component such as an amine-based reagent, e.g. a melamine or benzoguanamine material. Resins used in negative-acting photoresists preferably contain primary or secondary alcohol moieties.

Sulfonamide polymers or other sulfonamide components of the invention may be employed in photoresists imaged at sub-200 nm wavelengths such as 193 nm or 157 nm, and thus preferably will be substantially free of any phenyl or other aromatic groups. For example, preferred polymers for such sub-200 nm imaging contain less than about 5 mole percent aromatic groups based on total units of the polymer, more preferably less than about 1 or 2 mole percent aromatic groups, still more preferably less than about 0.1, 0.02, 0.04 or 0.08 mole percent aromatic groups based on total units of the polymer. Particularly preferred polymers for 193 nm or 157 nm imaging are completely free of aromatic groups.

Sulfonamide polymers or other sulfonamide components of the invention also may be suitably utilized in resists imaged at higher wavelengths, such as wavelengths less than 300 nm, particularly 248 nm. Such polymers suitably will contain aromatic groups such as provided by polymerization of an aromatic group, e.g. a phenyl group substituted with a trichlorosilyl group, trialkoxysilyl, and the like.

Photoresists of the invention that contain a silicon material such as an organosilicon resin (e.g. a silsesquioxane resin that has sulfonamide substitution) are preferably employed in multilayer lithography systems. More particularly, preferred uses of Si-containing resists of the invention include application of a first organic polymer coating on a substrate, e.g. a microelectronic wafer, and applying thereover (or above) a photoresist of the invention. The organic bottom layer suitably may be non-photoimageable (e.g. not contain a photoacid generator compound) but is thermally crosslinked prior to application of the resist layer. The bottom layer may comprise a phenolic polymer such as a novolac or poly(vinylphenol) admixed with a thermal acid generator compound and a crosslinker. Use of such a bottom layer can enable application of a very thin top resist layer.

Preferred bottom layer compositions are disclosed in WO 02/091083 (PCT/US02/14732) of the Shipley Company.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate, optoelectronic device substrate or liquid crystal display substrate or other flat panel display substrate having coated thereon a polymer, photoresist or resist relief image of the invention. The invention also includes methods to produce such articles of manufacture, which comprise use of a photoresist of the invention.

Other aspects of the invention are disclosed infra

DETAILED DESCRIPTION OF THE INVENTION

As discussed above, we have now provide new photoresist compositions that contain one or more components having sulfonamide and Si substitution. Preferred photoresist compositions of the invention contain an Si-polymer such as a silsesquioxane and may be employed in multilayer resist systems. Preferably, the Si-polymer has both sulfonamide substitution as well as moieties that can provide contrast upon exposure to photogenerated acid (i.e. photoacid-labile groups in a positive-acting resist or groups that can undergo crosslinking in a negative-acting resist).

Generally preferred polymers of the invention include those that contain Si atoms as a component of the polymer backbone, e.g. Si—O linkages, rather than a polymer that does not contain Si atoms as part of the backbone or substantial part thereof, but rather as pendant groups. More particularly, preferred polymers include those where at least 5 percent of the total number of atoms in the polymer backbone are Si atoms, or where at least about 10, 15, 20, 25, 30, 35, 40, 45, or 50 percent of the total number of atoms in the polymer backbone are Si atoms.

Preferred polymers of the invention include those that are formed from polymerization of a silyl halide or silyl alkoxide, particularly a silyl trihalide or trialkoxy silane such as reagent of the formula R—Si(halide)$_3$ e.g. R—Si(Cl)$_3$. The R moiety suitably may be aromatic (e.g. phenyl or naphthyl) or non-aromatic such as an optionally substituted alkyl or alicyclic groups such as norbornyl, adamantyl or the like. Such R groups may be substituted by a photoacid-labile group e.g. acid-labile ester such as t-butyl ester or acetal group, or an acetal group, or by aqueous base-solubilizing groups such as a fluorinated alcohol, sulfonamide, thiol, or the like.

Preferred units of polymers of the invention include those that comprise the following groups 1 through 8; the lines from each Si atom indicate chemical bonds to further hydrogen or non-hydrogen substituents.

1. Aqueous-base solubilizing groups:

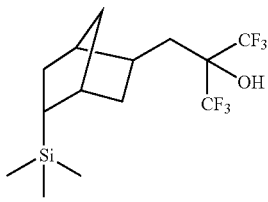

1

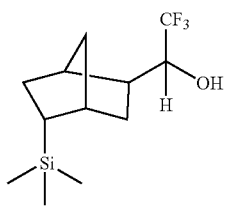

2

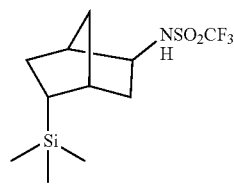

3

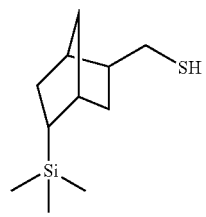

4

2. Photoacid-labile groups:

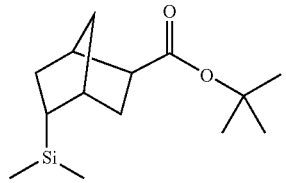

5

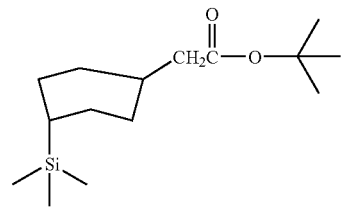

6

3. "Inert" groups (i.e. groups that are free of any hydroxy, carboxy or other aqueous base-solubilizing groups or any photoacid-labile groups):

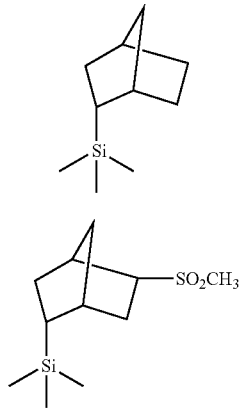

As mentioned above, preferred photoacid-labile groups of polymers of the invention include photoacid-labile ester or acetal groups, such as may be grafted onto —OH groups.

For instance, a haloacetate reagent such as tert-butyl chloroacetate ($ClCH_2CO_2C(CH_3)_3$) may be reacted with a hydroxy moiety such as a phenolic hydroxy. A carbonate reagent also may be reacted with a hydroxy moiety to provide pendant photoacid-labile esters, e.g. di-tert-butyl dicarbonate ($O[CO_2C(CH_3)_2]_2$) may be reacted with polymer hydroxy groups to provide pendent acid-labile ester groups. Reactions of such haloacetate or dicarbonate reagents may be suitably conducted under either acidic or basic conditions such as in the presence of potassium t-butoxide or N,N-dimethylaminopyridine. Basic reaction conditions are generally preferred.

A vinyl ether compound also suitably may be grafted onto a polymer hydroxy moiety to provide a photoacid-labile acetal group, e.g. a compound having at least one —(CH=CH)—O— groups such as ethylvinyl ether, t-amylvinyl ether, t-butylvinyl ether, vinylisobutyl vinyl ether, vinylpropyl ether, vinyl-2-ethylhexyl ether, vinyloctadecyl ether, and the like, as well as compounds that have two vinyl groups such as hydroxybutylvinyl ether, butanediol-1,4-divinyl ether, cyclohexylvinyl ether, hexanedioldivinyl ether, and the like, as well as compounds having three vinyl groups such triethyleneglycol divinyl ether, diethyleneglycol monovinyl ether, and the like, as well as compounds having 4 or more vinyl groups such as 1,4-cyclohexanoldimethanoldivinyl ether, propenyl ether of propylene carbonate, 1,1,1-tris(vinyloxymethyl)ethane, cyclohexanedimethanolmonovinyl ether, and the like.

Suitably, to provide acetal photoacid-labile groups, such vinyl ether compounds may be grafted onto a hydroxy group (e.g. a phenolic group or alcohol group such as $C_{1-12}$hydroxyalkyl) under acidic conditions preferably after dissolving the hydroxy-containing compound and the vinyl ether reagent in a suitable solvent such as one or more of acetone, tetrahydrofuran, diglyme and dioxane. Suitable acid catalysts to use to provide acidic conditions include hydrochloric acid, sulfuric acid, malonic acid and/or a sulfonic acid. Preferably, the molar ratio of free hydroxyl groups to the vinyl ether compound does not exceed 1 to 1, and more preferably the hydroxyl groups are present in a molar excess (e.g. 2:1) relative to the vinyl ether compound. In particular, a preferred synthesis includes grafting vinyl ether onto a preformed Si polymer having hydroxy groups, where only a portion of the polymer hydroxy groups are blocked with photoacid-labile groups and a portion of the polymer hydroxy groups remain unblocked as aqueous, alkaline developable groups.

Preferred repeat units that can contribute to aqueous developability of a photoresist containing the polymer include hydroxy, carboxy and other polar preferably acidic groups such as sulfonic acid and the like. For instance, a preferred repeat unit of this type is a hydroxy-containing unit, such as a phenolic unit, or an alcohol unit. However, for at least many preferred aspects of the invention, references herein to aqueous base-solubilizing groups or other similar term does not include a group containing a silanol moiety.

In such copolymers, units that are free of photoacid-labile and aqueous, alkaline developing groups will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties; e.g. preferred repeat units of this type are alkyl(including cycloalkyl such as norbornyl) or phenyl groups that are either unsubstituted or substituted by one or more halo, unsubstituted alkyl, non-photoacid labile alkoxy, sulfonyl acid esters, and the like. Such substituents should be substantially stable (i.e. not undergoing a deblocking reaction) under typical lithographic conditions (e.g. pre-exposure thermal treatment of up to 140° C. for 1–2 minutes; exposure; post-exposure thermal treatment of up to about 160° C. for 1–2 minutes; and/or development with an aqueous, alkaline developer solution). Preferred substituents that are non-photoacid-labile and do not substantially promote aqueous developability useful for this type of repeat unit are disclosed as inert blocking groups in U.S. Pat. Nos. 5,736,536 and 5,541,263 both to Thackeray et al. of the Shipley Company. As disclosed in those patents, suitable substituents that are substantially inert to lithographic processing and do not substantially increase aqueous, alkaline developability of a resist containing the polymer include alkoxy groups such as methoxy, ethoxy, propoxy, n-butoxy, sec-butoxy, etc.; alkyl esters represented by RCOO— where R is preferably an alkyl group having 1 to 6 carbon atoms such as methyl, ethyl, propyl, isopropyl, butyl, etc.; sulfonyl acid esters include both alkyl (e.g. $C_{1-6}$alkyl) are carbocyclic aryl esters such as methane sulfonyl, ethane sulfonyl, propane sulfonyl, benzene sulfonyl, and toluene sulfonyl esters, etc. All those groups can be grafted onto hydroxy groups as discussed above to form sulfonyl esters, e.g. by reaction of an alkylhalide such alkylchloride to form an alkoxy group, or an acid halide such as acid chloride to form an alkylester.

Such Si polymers containing two or three distinct repeat can be readily prepared. For instance, a hydroxy-Si reagent can be polymerized such as a hydroxylalkyl silyl reagent. A formed hydroxy-Si polymer can be functionalized to provide multiple distinct repeat units, e.g. pendant hydroxy groups can be reacted to have both photoacid-labile groups (such as by reaction of a dicarbonate or a haloacetate ester as discussed above) and non-photoacid-labile groups such as provided by reaction of a sulfonyl acid or acid chloride or the like. Preferably, those distinct groups are reacted sequentially with the pre-formed hydroxy Si polymer, although it is possible to make both additions to the pre-formed polymer in a single reaction sequence. Preferably, a portion of the hydroxy moieties are left unreacted (i.e. unsubstituted) to provide aqueous, alkaline developing enhancing OH groups.

In suitable copolymers for use in photoresists of the invention, each distinct repeat units may be suitably present in a variety of relative amounts. For example, repeat units that have photoacid-labile groups suitably may be present in a polymer from about 1, 2 or 3 to about 60 or 70 mole percent, based on total repeat units of the polymer, more preferably about 5, 10 or 20 to about 30, 40 or 50 mole percent based on total units of the polymer. The repeat unit(s) that do not contain photoacid labile groups and do not substantially increase aqueous, alkaline developability (e.g. mesyl-substituted phenyl) suitably may be present in a polymer from about 1, 2 or 3 to about 50 or 60 mole percent, based on total repeat units of the polymer, more preferably about 5, 10 or 20 to about 30 or 40 or 50 mole percent based on total units of the polymer. The repeat units that in a polymer from about 10, 20 or 25 to about 30, 40 or 50 mole percent based on total units of the polymer, more preferably from about 10 to about 40 mole percent of aqueous base-solubilizing groups in the polymer based on total units of the polymer.

As mentioned above, preferred Si-polymers for use in a negative-acting resist composition will contain primary and secondary hydroxy moieties, suitably primary or second alcohol groups that may be present as hydroxy$C_{1-20}$alkyl groups. Such primary and secondary hydroxy can be effective sites or moieties for crosslinking.

Preferred polymer units for a polymer used in a negative-acting resist include those of the following formula:

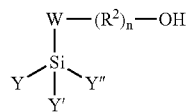

wherein in that above formula, Y, Y' and Y" are each independently a chemical bond to another polymer, hydrogen or a non-hydrogen substituent such as hydroxy, optionally substituted $C_{1-20}$alkyl(includes cycloalkyl such as norbornyl or adamantyl), optionally substituted carbocyclic aryl such as optionally substituted phenyl or naphthyl and the like;

each W is a linker, e.g. a chemical bond, an optionally substituted carbocyclic aryl such as optionally substituted phenyl, naphthyl or anthracene, an optionally substituted alkyl such as optionally substituted $C_{1-20}$alkyl(includes cycloalkyl such as norbornyl or adamantyl), and the like; and $R^2$ is optionally substituted alkylene (including branched alkylene) suitably having from 1 to about 12 carbon atoms;

n is 0 (where $R^2$ is not present) or n is 1;

wherein W or $R^2$ provide a primary or secondary carbon that is covalently linked to the depicted hydroxyl.

Preferred syntheses of monomers and polymers incorporating such monomers that are useful in photoresists of the invention are disclosed in the examples which follow.

Thus, for instance, Example 3 below exemplifies preparation of a substituted sulfonamide silyl reagent (trihalide silyl reagent) through reaction of an unsaturated alkyl amine with a substituted sulfonyl chloride to form an unsaturated substituted sulfonamide. $HSiCl_3$ is then reacted across the carbon-carbon double bond of the formed unsaturated sulfonamide preferably in the presence of a metal catalyst such as a Pt catalyst and at elevated temperature, e.g. at reflux temperature of an aromatic solvent such as toluene or xylene. The formed trihalide silyl reagent then can be reacted with other silyl reagents to form Si-polymer with substituted sulfonamide groups, as exemplified in Example 3 below and discussed above. See also Example 4 which follows.

A thiol silyl reagent (e.g. trihalide silyl reagent) can be formed by similar procedures. For instance, an unsaturated alkyl sulfide e.g. allyl mercaptan can be reacted with $HSiCl_3$ preferably in the presence of a metal catalyst such as a Pt catalyst and at elevated temperature, e.g. at reflux temperature of an aromatic solvent such as toluene or xylene. The trichlorosilyl reagent will add $SiCl_3$ to an unsaturated carbon. The formed trihalide silyl reagent then can be reacted with other silyl reagents to form Si-polymer with thio moieties.

Preferred syntheses of Si-polymers having sulfonamide substitution are disclosed in Example 7 and 8 which follow. Briefly, one or more (e.g. two or three or more) reactive Si monomers such as a trihalo-Si reagent are admixed and reacted at room temperature or elevated temperatures such as reflux. Suitably, the reaction is carried out under basic conditions, such as in the presence of KOH, NaOH or other suitable base. To push the reaction to completion, water generated as a result of the condensation may be suitably removed such as through azeotrope.

Synthesis of Si polymers are also disclosed in WO 02/091083 (PCT/02/14732) of the Shipley Company.

As mentioned above, various groups of Si-compounds and Si-polymers may be optionally substituted, including groups of the above formulae (I), (II) and (III). A group that is optionally substituted refers to the specified moiety that may be substituted at one or more available positions by one or more suitable groups such as, e.g., halogen such as fluoro, chloro, bromo and iodo; cyano; hydroxyl; nitro; azido; alkanoyl such as a $C_{1-6}$ alkanoyl group such as acyl and the like; carboxamido; alkyl groups including those groups having 1 to about 12 carbon atoms or from 1 to about 6 carbon atoms and more preferably 1–3 carbon atoms; alkenyl and alkynyl groups including groups having one or more unsaturated linkages and from 2 to about 12 carbon or from 2 to about 6 carbon atoms; alkoxy groups having those having one or more oxygen linkages and from 1 to about 12 carbon atoms or 1 to about 6 carbon atoms; aryloxy such as phenoxy-, alkylthio groups including those moieties having one or more thioether linkages and from 1 to about 12 carbon atoms or from 1 to about 6 carbon atoms; alkylsulfinyl groups including those moieties having one or more sulfinyl linkages and from 1 to about 12 carbon atoms or from 1 to about 6 carbon atoms; alkylsulfonyl groups including those moieties having one or more sulfonyl linkages and from 1 to about 12 carbon atoms or from 1 to about 6 carbon atoms; and the like.

Photoimageable compositions of the invention are preferably used in multiple-layer systems, i.e. where the photoimageable composition is disposed over a further organic (polymer composition) layer that itself is disposed over a substrate surface such as a microelectronic wafer or device substrate or an optical waveguide substrate.

Preferred underlayer compositions include those that comprise a phenolic polymer such as a novolak and/or poly(vinylphenol). Also preferred is where the underlying polymer composition is a crosslinking composition, e.g. contain an acid or acid generator compound such as a thermal acid generator compound and preferably a separate crosslinker component such as an amine-based material, e.g. a melamine or benzoguanamine resin. For such crosslinking composition, the applied underlayer may be crosslinked prior to application of the overcoated photoimageable composition, e.g. by suitable thermal treatment such as heating at 140° C., 150° C., 160° C., 180° C., 200° C. or 230° C. for a time sufficient for crosslinking such as 0.5, 1 or 2 minutes. The underlying polymer composition is suitably non-photoimageable and does not contain a photoacid generator compound.

Suitably, more than one silicon-containing polymer may be used in the present photoimageable compositions. Thus, the present photoimageable compositions may include one, two or more silicon-containing polymers. When two or more silicon-containing polymers are used, preferably at least one is a sulfonamide-substituted silicon-containing polymer of the present invention. The remaining silicon-containing polymers may be conventional silicon-containing polymers or polymers of the present invention. In this way, blends of polymers may be advantageously used in the present photoimageable compositions. Such blends include blends of the present silicon-containing polymers with non-silicon-containing polymers. In these blends, any of a variety of ratios of polymers is suitable. The specific ratio will depend upon the particular polymers combined and the characteristics (dissolution rate, etch resistance, photospeed, etc.) desired and are within the ability of one skilled in the art.

A wide variety of photoactive components may be used in the present invention, including, but not limited to, photoacid generators and photobase generators. Photoacid generators are preferred. It will be appreciated by those skilled in that art that more than one photoactive component may be used advantageously in the photoimageable compositions of the present invention.

Photoacid generator compounds useful in the present invention include a wide variety of compounds which liberate acid upon exposure to activating radiation, e.g. sub-300 nm radiation such as 248 nm, or sub-200 nm radiation such as 193 nm or 157 nm. Suitable photoacid generators include e.g. halogenated triazines, onium salts, sulfonated esters and halogenated sulfonyloxy dicarboximides.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, and 2-(1-(2,3-benzodioxolyl))-4,6-bis(tribromomethyl)-1,3,5-triazine. Other useful triazine photoacid generator compounds are disclosed WO 02/091083 (PCT/02/14732) of the Shipley Company. Further additional triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference. Sulfonium salts such as triphenylsulfonium hexafluorophosphate are preferred.

Particularly suitable onium salt photoacid generator compounds for use in photoresists of the invention are iodonium and sulfonium compounds such as e.g. triphenylsulfonium perfluorobutanesulfonate.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337–340 (1991), incorporated herein by reference.

Suitable halogenated sulfonyloxy dicarboximides useful as photoacid generators in the present invention include, but are not limited to: 1-(((trifluoromethyl)sulfonyl)oxy)-1H-pyrrole-2,5-dione; N—((perfluorooctanesulfonyl)oxy)-5-norbornene-2,3-dicarboximide; N—(((trifluoromethylsulfonyl)oxy)-5-norbornene-2,3-dicarboximide; and 1-(((trifluoromethyl)sulfonyl)oxy)-2,5-pyrrolidinedione. Additional useful sulfonyloxy dicarboximide photoacid generators are disclosed WO 02/091083 (PCT/02/14732) of the Shipley Company.

In positive-acting systems of the present invention, the photoactive components are typically added to photoimageable compositions in an amount sufficient to generate a latent image in a coating layer of resist material upon exposure to activating radiation. When the photoactive component is a photoacid generator, the amount is typically in the range of 0.1 to 15 percent by weight, based on the weight of the resin, and preferably 1 to 8 percent by weight.

In negative-acting systems of the present invention, the amount of photoactive component useful is any amount sufficient to catalyze cross-linking of the silicon-containing polymer or oligomer. The photoactive components are typically used in the range of 0.1 to 25% by weight, based on the weight of the composition. It is preferred that the photoactive component is present in an amount in the range of 0.1 to 15% by weight, more preferably in the range of 0.1 to 12% by weight, and still more preferably less than or equal to 5% by weight. A particularly suitable range is from 0.1 to 5% by weight.

Negative-acting resist preferably include one or more cross-linking agents. Any aromatic or aliphatic cross-linking agent that reacts with the silicon-containing polymer or oligomer is suitable for use in the present invention. Such organic cross-linking agents will cure to form a polymerized network with the silicon-containing polymer or oligomer, and reduce solubility in selected solvents. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to: amine containing compounds, epoxy containing materials, compounds containing at least two vinyl ether groups, allyl substituted aromatic compounds, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylaniide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Particularly suitable amine-based cross-linking agents include those of formula:

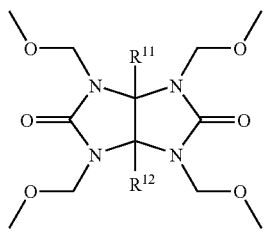

wherein $R^{11}$ and $R^{12}$ are independently selected from H, $(C_1-C_6)$alkyl and phenyl. Preferred alkyl groups for $R^{11}$ and $R^{12}$ are methyl and propyl.

Epoxy containing materials useful as cross-linkers in the present invention are any organic compounds having one or more oxirane rings that are polymerizable by ring opening. Such materials, broadly called epoxies, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxies may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials in the present invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxides, such as bisphenol A ethoxylated diepoxide. Further examples of epoxides of this type are described in U.S. Pat. No. 3,018,262, herein incorporated herein by reference to the extent this patent teaches the preparation of such epoxides.

Suitable epoxides useful in the present invention include, but are not limited to: epichlorohydrin, glycidol, glycidylmethacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis(3,4-epoxy-6-methylcyclohexylmethyl) adipate (e.g., ERL-4289 from Union Carbide Corp.), bis(2,3-epoxycyclopentyl)ether (e.g., ERL-0400 from Union Carbide Corp.), aliphatic epoxy modified with polypropylene glycol (e.g., ERL-4050 and ERL4269 from Union Carbide Corp.), dipentene dioxide (e.g., ERL-4269 from Union Carbide Corp.), flame retardant epoxy resins (e.g., DER-580, a brominated bisphenol type epoxy resin available from Dow Chemical Co.), 1,4-butanediol diglycidyl ether of phenolformaldehyde novolak (e.g., DEN-431 and DEN438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or aralphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Suitable allyl substituted aromatic compounds useful as cross-linkers in the present invention are those containing one or more allyl substituents, that is, the aromatic compound is substituted at one or more ring positions by the allylic carbon of an alkylene group). Suitable allyl aromatics include allyl phenyl compounds, such as an allyl phenol. An allyl phenol crosslinker can be a monomer or polymer that contains one or more phenol units where the phenol units are substituted at one or more ring positions by an allylic carbon of an alkylene group. Typically the alkylene substituent(s) is propenyl, i.e., the phenol has one or more propenyl substituents. Preferred allyl phenols include a polycondensate of phenol and hydroxybenzaldehyde and an allylhalide such as allylchloride. A number of suitable allyl phenols are commercially available, for example the allyl phenol sold under the trade name THERMAX SH-150AR by Kennedy and Klim, Inc. (Little Silver, N.J.). Allyl phenyl compounds including allyl phenols are also described in U.S. Pat. No.

4,987,264, herein incorporated by reference to the extent this patent teaches the preparation of such compounds.

Particularly suitable organic cross-linking agents include those containing one or more methoxymethyl groups, such as methoxymethyl-substituted melamines and methoxymethyl-substituted glycourils such as those of formula IV, above. Hexamethoxymethylmelamine is a preferred methoxymethyl-substituted melamine. It is further preferred that one or more of the hydrogens of the organic cross-linking agent, and more preferably one or more of the methyl hydrogens in the methoxymethyl substituent, is substituted with a halogen, preferably fluorine. Thus, preferred cross-linkers include those containing one or more methoxyfluoromethyl and/or methoxydifluoromethyl substituents. Exemplary preferred fluorinated cross-linking agents include methoxyfluoromethyl- and methoxydifluoromethyl-substituted melamines and glycourils, such as hexamethoxyfluoromethylmelamine and hexamethoxydifluoromethylmelamine. Also suitable are fluorinated epoxy cross-linking agents. For certain applications, it is preferred that the cross-linking agent is fluorinated.

The compositions of the present invention may suitably comprise only a single type of organic cross-linker, e.g., only an amine containing cross-linker, or may contain two or more different cross-linkers. When a combination of organic cross-linkers is used in the present invention, it is preferred that the combination include an amine containing compound and an epoxy containing compound. The concentration of organic cross-linking agents in the compositions of the present invention may vary within a relatively wide range. It will be appreciated by those skilled in the art that suitable organic cross-linker concentrations will vary with factors such as cross-linker reactivity and specific application of the composition. Typically, the cross-linking agent(s) is present in an amount in the range of 0.1 to 80% by weight, based on the total weight of the composition, preferably in the range of 0.5 to 50%, and more preferably in the range of 1 to 25%. It is preferred that a cross-linking agent is used in the compositions of the present invention.

The photoimageable compositions of the present invention may optionally further include one or more additional components, including, but not limited to, solvents, antistriation agents, plasticizers, surfactants, base additives, speed enhancers, fillers, dyes and the like. In positive-acting systems, a base additive is typically used to adjust the photospeed of the composition. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

The photoimageable compositions of the present invention may be readily prepared by those skilled in the art. For example, a photoresist composition of the invention can be prepared by dissolving the components of the photoresist, i.e. polymer binder and photoactive component, in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof.

Typically, the solids content of the photoresist composition varies from about 5 to about 35 percent by weight, based on the total weight of the composition. The resin binder and photoactive components should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

As discussed above, the present photoimageable compositions are particularly suitable for use as a top layer in a bilayer photoresist system. As also discussed above, in such a system, a bottom layer of a conventional photoresist, such as novolac polymer based resist, inert polyarylether-sulfone copolymer based resist or a novolac or polyhydroxystyrene-based thermally cross-linkable system. Such bottom layer is typically applied to or coated on a substrate using any of the above described procedures. The bottom layer is then hard baked such as at 230° C. for 2 minutes, after which the present photoimageable compositions are coated on the cured bottom layer. The bottom layers preferably contain an amount of a UV absorbing component, such as an anthracene dye, sufficient for optical density and etch performance. The bottom layers typically have a thickness of from 0.4 to 1 μm. The top layer of the present photoimageable compositions is typically from 0.05 to 1 μm thick, preferably from 0.1 to 0.5 μm, and more preferably from 0.1 to 0.3 μm.

After being coated on the bottom layer, the present photoimageable composition top layer is dried by heating (baked) to remove any solvent. It is preferably dried until the coating is tack free. Thereafter, it is imaged through a mask in a conventional manner. The exposure is sufficient to effectively activate the photoactive component of the photoresist to produce a patterned image in the resist coating layer, and more specifically, the exposure energy typically ranges from about 1 to 100 mJ/cm$^2$, dependent upon the exposure tool and the components of the photoresist composition.

The photoimageable compositions of the present invention may be activated by a variety of exposure wavelengths, such as 248, 193, 157 nm and 11–15 nm, as well as other sources of activating radiation such as visible, e-beam, ion-beam and x-ray.

Following exposure, the film top layer of the composition is preferably baked at temperatures ranging from about 70° C. to 160° C. Thereafter, the top layer film is developed to form an etch pattern. The exposed resist film is rendered positive working by employing a polar developer, preferably an aqueous based developer, such as quaternary ammonium hydroxide solutions, such as tetra-alkyl ammonium hydroxide, preferably a 0.15 to 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

The pattern is next transferred to the underlayer or bottom layer by etching, such as with an oxygen reactive ion etch process. After such processing, the resists, both top and bottom layers, may be removed from the processed substrate using any stripping procedures known in the art.

The present photoimageable compositions are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compositions of the invention. Other chemical vapor deposited layers, such as cap layers, etch stops and the like, may also be used as substrates.

Alternatively, the present compositions may be used in optoelectronics applications, such as in the manufacture of optical waveguides. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art.

In one embodiment, optical waveguides may be prepared by first disposing a layer of the present compositions on a substrate by any means including, but not limited to, screen coating (or screen printing), curtain coating, roller coating, slot coating, spin coating, flood coating, electrostatic spray, spray coating, dip coating or as a dry film. When the compositions of the present invention are spray coated, a heated spray gun may optionally be used. The viscosity of the composition may be adjusted to meet the requirements for each method of application by viscosity modifiers, thixotropic agents, fillers and the like. Any substrate suitable for supporting a waveguide may be used with the present compositions. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits, liquid crystal display ("LCD") glass substrates and the like.

The coated substrate is typically then cured, such as by baking, to remove any solvent. Such curing may be a variety of temperatures, depending upon the particular solvent chosen. Suitable temperatures are any that are sufficient to substantially remove any solvent present. Typically, the curing may be at any temperature from room temperature (i.e., 25° C.) to 170° C. Such curing typically occurs over a period of from 5 seconds to 30 minutes. Such curing may be affected by heating the substrate in an oven or on a hot plate.

After curing, the layer of the present composition disposed on the substrate is then imaged by exposure to actinic radiation through appropriate artwork or a mask. Following exposure, the composition is then cured at a temperature of from 40° to 170° C. Curing time may vary but is generally from about 30 seconds to about 1 hour. While not intending to be bound by theory, it is believed that upon exposure to actinic radiation the silsesquioxane oligomer cross-links, particularly with the optional cross-linking agent. The exposed areas are rendered less soluble than the unexposed areas. Thus, the unexposed areas may be removed, such as by contact with a suitable solvent, aqueous developer or solvent-water mixture, leaving only the exposed areas remaining on the substrate. Suitable aqueous developers include alkali metal hydroxides such as sodium hydroxide and potassium hydroxide in water as well as tetraalkylammonium hydroxide in water. Such developers are typically used in concentrations from 0.1 to 0.3 N, such as 0.15 to 0.26 N tetramethylammonium hydroxide in water. The choice of developer is well within the ability of those skilled in the art. Such development may be at a variety of temperatures such as from room temperature to about 100° C. The time of such development depends upon the material to be removed and the temperature used, but is generally from about 10 seconds to about 1 hour.

Following development, the present waveguides may undergo a final cure step, or re-flow step. In such final cure step, the waveguides may be heated at a temperature in from about 130° to 225° C. in air or inert atmospheres such as nitrogen or argon. Such final cure step aids in removal of residual solvent, removal of hydroxyl groups from the silsesquioxane polymer such as by increasing the extent of cross-linking, alter the waveguide profile such as to reduce surface roughness, and improves the optical transmission properties of the material.

Optical waveguides typically have a core and a cladding, wherein the cladding has a lower index of refraction as compared to the core. Particularly useful waveguides have core having an index of refraction of from 1.4 to 1.55. Typically, suitable cladding has an index of refraction of from 1.3 to 1.54.

It is preferred that a cladding layer is first deposited on a substrate. If the cladding layer is photocurable or thermocurable, it may be blanket cured as a first step. The photodefinable core material is then deposited on the cladding layer, imaged and the unexposed areas optionally removed. A second cladding layer is then deposited on the imaged waveguide. The second cladding layer may be the same or different from the first cladding layer. However, the indices of refraction of the first and second cladding layers should be the same. The second cladding layer is then cured, or imaged in the case of a photocurable cladding composition, to provide a waveguide structure.

The Si oligomers and polymers of the present invention are suitable for use in the cladding and/or core of the present optical waveguides. Preferably, the present photodefinable compositions are used to prepare cores for optical waveguides. It will be appreciated that the refractive index of a photodefinable composition including a present Si oligomer and one or more organic cross-linking agents may be modified by changing the amount and type of the one or more cross-linking agents selected and/or photoactive component. Thus, the present compositions may be useful as core or cladding material depending upon the type and quantity of cross-linking agents selected.

In an alternate embodiment, the present compositions may be used to make porous optoelectronic devices, such as porous core and/or cladding materials in waveguides. Such porous optoelectronic devices may be prepared according to the same methods used to prepare porous dielectric materials.

All documents mentioned herein are incorporated herein by reference. The following non-limiting examples are illustrative of the invention.

EXAMPLE 1

Synthesis of Sulfonamide Monomer

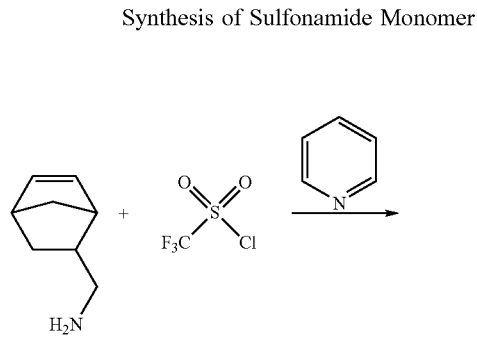

The silyl norbornyl sulfonamide monomer designated as "A" in the immediately above scheme was prepared as follows.

All reaction glassware was dried in the oven overnight at 100° C. The glassware was set up and cooled under a stream of nitrogen. The reaction was carried out under a blanket of nitrogen.

Into a dry 250 ml 3 necked flask quipped with a magnetic stirrer, condenser and an addition funnel was added 80 ml dry tetrahydrofuran, 9.7 g of pyridine and 12.3 g of Norbornene amine. The reaction mixture was cooled to 0° C. and 16.9 g of trifluoromethanesulfonylchloride was added to this mixture and stirred for 4 h. After stirring for 4 h, the pyridinium salt was filtered off and the THF was evaporated to dryness. The resulting solid was dissolved in diethylether and washed with 3.5% HCl followed by DI water till the pH 7. The ether was dried over sodium sulphate and evaporated the solvent to get an oily product. The product was analyzed by $^1H$, $^{13}C$ and $^{19}F$ NMR and it was further hydrosilylated by the following procedure:

A 100 ml 2 necked round bottomed flask quipped with refluxing condenser and an addition funnel flushed with nitrogen for 10 min and charged 200 mg of platinum-divinyltetramethyldisiloxane complex and 25 ml of toluene. The mixture was stirred at room temperature. 10.0 g of the above mixture was added (all at once) to this clear solution followed by the drop wise addition of 20 g of trichlorosilane (total addition time ~10 min) at room temperature. The whole mixture was stirred at 50° C. for 48 h, after which the solvent and the unreacted starting materials were distilled off. The crude product was subjected to $^1H$ and $^{13}C$ NMR (yield>95%).

EXAMPLE 2

Synthesis of Additional Monomer Useful for Preparation of Polymers of the Invention.

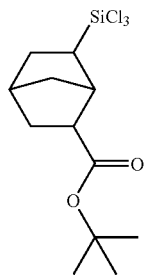

All reaction glassware was dried in the oven overnight at 100° C. The glassware was set up and cooled under a stream of nitrogen. The reaction was carried out under a blanket of nitrogen.

A 100 ml 2 necked round bottomed flask quipped with refluxing condenser and an addition funnel flushed with nitrogen for 10 min and charged 60 mg of palladium acetate and 180 mg of triphenylphosphene and 25 ml of toluene. 10.0 g of Norbornene tert-butylester was added (all at once) to this clear solution. The whole mixture was stirred at room temperature. To this mixture was added drop wise 20 g of trichlorosilane (total addition time ~10 min) at room temperature. The whole mixture was stirred at 50° C. for 48 h, after which the solvent and the unreacted starting materials were distilled off. The crude product was subjected to $^1H$ and $^{13}C$ NMR (yield>95%).

EXAMPLE 3

Synthesis of Additional Monomer Useful for Preparation of Polymers of the Invention.

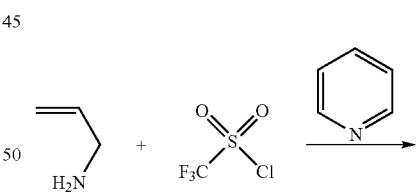

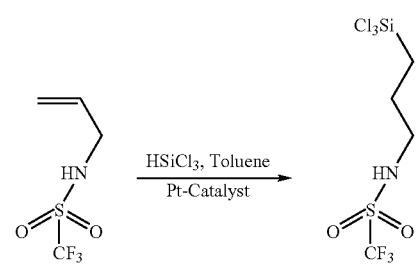

The silyl alkyl sulfonamide monomer shown in the immediately above scheme was prepared as follows.

All reaction glassware was dried in the oven overnight at 100° C. The glassware was set up and cooled under a stream of nitrogen. The reaction was carried out under a blanket of nitrogen.

Into a dry 250 ml 3 necked flask quipped with a magnetic stirrer, condenser and an addition funnel was added 80 ml dry tetrahydrofuran, 9.7 g of pyridine and 5.7 g of allyl amine. The reaction mixture was cooled to 0° C. and 16.9 g of trifluoromethanesulfonylchloride was added to this mixture and stirred for 4 h. After stirring for 4 h, the pyridinium salt was filtered off and the THF was evaporated to dryness. The resulting solid was dissolved in diethylether and washed with 3.5% HCl followed by DI water till the pH=7. The ether was dried over sodium sulphate and evaporated the solvent to get an oily product. The product was analyzed by $^1$H, $^{13}$C and $^{19}$F NMR and it was further hydrosilylated by the following procedure:

A 100 ml 2 necked round bottomed flask quipped with refluxing condenser and an addition funnel flushed with nitrogen for 10 min and charged 200 mg of platinum-divinyltetramethyldisiloxane complex and 25 ml of toluene. The mixture was stirred at room temperature. 10.0 g of the above mixture was added (all at once) to this clear solution followed by the drop wise addition of 20 g of trichlorosilane (total addition time ~10 min) at room temperature. The whole mixture was stirred at 50° C. for 24 h, after which the solvent and the unreacted starting materials were distilled off. The crude product was subjected to $^1$H and $^{13}$C NMR (yield>80%).

EXAMPLE 4

Synthesis of Additional Monomer Useful for Preparation of Polymers of the Invention.

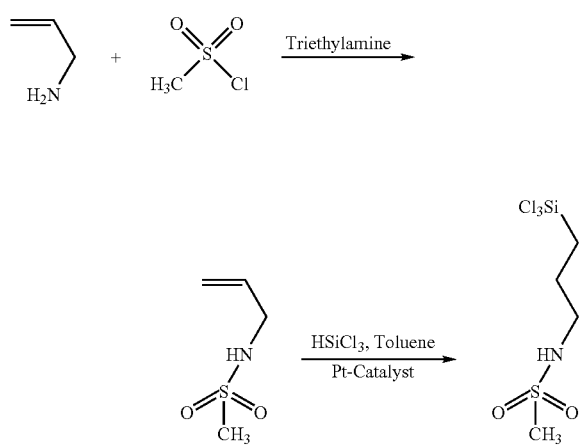

The silyl alkyl sulfonamide monomer shown in the immediately above scheme was prepared as follows.

All reaction glassware was dried in the oven overnight at 1001° C. The glassware was set up and cooled under a stream of nitrogen. The reaction was carried out under a blanket of nitrogen.

Into a dry 250 ml 3 necked flask quipped with a magnetic stirrer, condenser and an addition funnel was added 100 ml dry dichloromethane, 20.2 g of triethylamine and 10 g of allyl amine. The reaction mixture was cooled to 0° C. and 20.1 g of methanesulfonylchloride was added to this mixture and stirred for 4 h. After stirring for 4 h, the triethylamine salt was filtered off and dichloromethane solution was washed with DI water till the pH=7. The dichloromethane was dried over sodium sulphate and evaporated the solvent to get an oily product. The product was analyzed by $^1$H, and $^{13}$C NMR and it was further hydrosilylated by the following procedure:

A 100 ml 2 necked round bottomed flask quipped with refluxing condenser and an addition funnel flushed with nitrogen for 10 min and charged 200 mg of platinum-divinyltetramethyldisiloxane complex and 25 ml of toluene. The mixture was stirred at room temperature. 10.0 g of the above mixture was added (all at once) to this clear solution followed by the drop wise addition of 20 g of trichlorosilane (total addition time ~10 min) at room temperature. The whole mixture was stirred at 50° C. for 24 h, after which the solvent and the unreacted starting materials were distilled off. The crude product was subjected to $^1$H and $^{13}$C NMR (yield>90%).

EXAMPLE 5

Synthesis of Additional Monomer Useful for Preparation of Polymers of the Invention.

| | Monomer Synthesis | | | |
|---|---|---|---|---|
| Material | Amt (g) | Amt (ml) | Moles | Source |
| 3-(5-bicyclo[2.2.1]hepten-2-yl)-1,1,1-trifluoro-2-(trifluoromethyl)propan-2-ol | 50 | | 0.182 | Central Glass |
| Trichlorosilane | 100 | ~75 | 0.738 | Gelest |
| Toluene | | 175 | | |
| Pt(divinyltetramethyl)disiloxane complex | | 5 drops | | |

All reaction glassware was dried in the oven overnight at 100C. The glassware was set up and cooled under a stream of nitrogen. The reaction was carried out under a blanket of nitrogen.

To a 500 ml 3N-RB flask fitted with a gas inlet, thermometer, overhead stirrer, condenser and a glass stopper was added 50 g 3-(5-bicyclo[2.2.1]hepten-2-yl)-1,1.,1-trifluoro-2-(trifluoromethyl)propan-2-ol 100 ml of toluene and the catalyst. To this solution was added the trichlorosilane followed by the remainder of the toluene (75 ml). The mixture was heated to 50–51° C. using a heating mantel. The reaction was held at 50–51C for 36 hours. The reaction was cooled to room temperature and the excess trichlorosilane and toluene were removed under reduced pressure leaving 67 g of a crude oil. The product was purified by high vacuum distillation to give 63.3 g of product (74° C./<1 mm).

EXAMPLE 6

Synthesis of Additional Monomer Useful for Preparation of Polymers of the Invention.

NBTFE Silane Monomer Synthesis

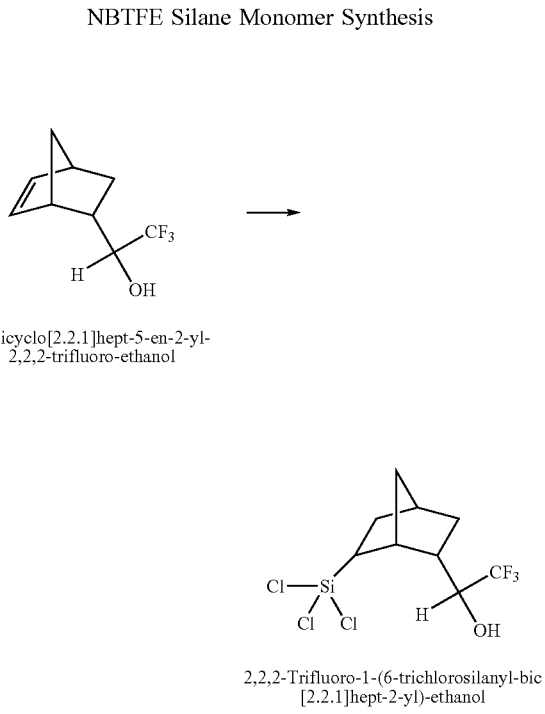

1-Bicyclo[2.2.1]hept-5-en-2-yl-2,2,2-trifluoro-ethanol 2,2,2-Trifluoro-1-(6-trichlorosilanyl-bic[2.2.1]hept-2-yl)-ethanol

| Material | Amt (g) | Amt (ml) | Moles |
| --- | --- | --- | --- |
| 1-Bicyclo[2.2.1]hept-5-en-2-yl-2,2,2-trifluoro-ethanol | 22 | | 0.114 |
| Trichlorosilane | 50 | ~36.5 | 0.368 |
| Toluene | | 75 | |
| Pt(divinyltetramethyl)disiloxane complex | 0.15 | | |

All reaction glassware was dried in the oven overnight at 100° C. The glassware was set up and cooled under a stream of nitrogen. The reaction was carried out under a blanket of nitrogen. The materials and amounts thereof are shown in the above Table.

To a 300 ml 3N-RB flask fitted with a gas inlet, thermometer, overhead stirrer, condenser and a glass stopper was added 22 g 1-Bicyclo[2.2.1]hept-5-en-2-yl-2,2,2-trifluoro-ethanol, 75 ml of toluene and the catalyst. To this solution was added the trichlorosilane (obtained from commercial vendor of Gelest). The mixture was heated to 50–51° C. using a heating mantel. The reaction was held at 50–51° C. for 72 hours. The reaction was cooled to room temperature and the excess trichlorosilane and toluene were removed under reduced pressure leaving 34 g of a crude oil. NMR indicated all the staring material was consumed. Theoretical yield ~37.3

EXAMPLE 7

Preparation of Sulfonamide Polymer

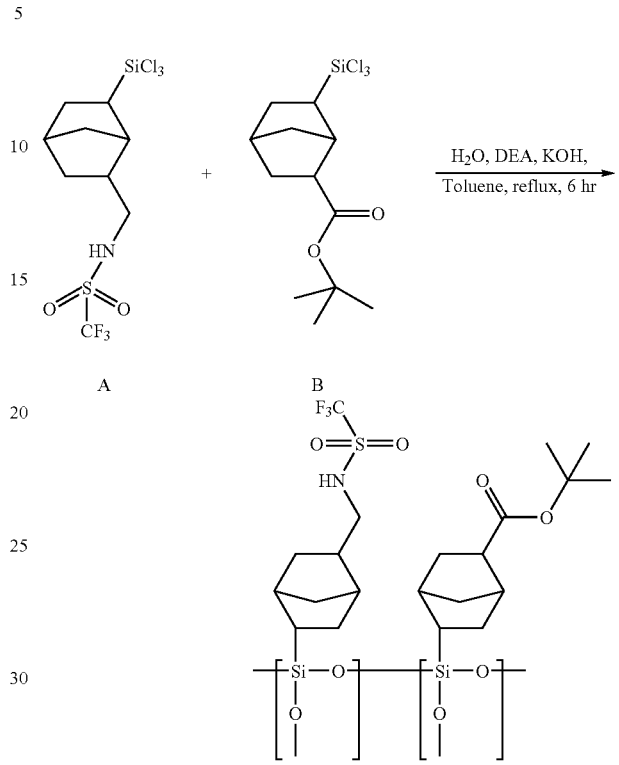

Monomer A and Monomer B shown in the immediately above scheme were prepared as described in Examples 1 and 2 above respectively.

To a 250 ml 3 necked Rb flask fitted with a thermometer and an addition funnel, gas inlet was added the solution of diethyl amine (11 g), deionized water (16.8 g) and toluene (10 ml). The flask temperature was between 0 to –5° C. To this chilled solution was added a mixture of the monomers (A and B in above scheme) and toluene (40 g) drop wise over a period of 55 min. (Note: at 0° C., there were two phases: a milky white bottom layer and a clear toluene top layer). After the addition was complete the whole mixture was allowed to come to room temperature and stirred for additional 1.5 hr. The two layers were separated by addition of extra water to dissolve the quaternary ammonium salt (Observation: apart from the two layers, an oily white material was found in the flask which was not soluble in water as well as in toluene at room temperature). However the oily materials dissolved completely in toluene when it was heated to 50° C. The toluene layer was washed with deinoized water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~200 ml) fitted with a thermometer, Dean-Stark trap and a condenser. To the total solution was added 0.21 g of KOH dissolved in 1 ml deinoized water followed by 1.0 ml of deinoized water rinse. The mixture was heated to reflux to azeotrope water that was added to the reaction and formed during condensation. The reflux was continued for 2 hr (Note: during reflux, removed toluene (10 mL)/water (3 mL) mixture from the Dean Stark condenser). After 2 hr reflux, the solution was brought into RT and washed with 20% acetic acid (2×50 ml) further with deinoized water until the pH=7. The toluene solution was washed with ion-exchange resin (IRN-150) for 2 hr. Filtered the resins and toluene was removed and the polymer was dried at 50° C. overnight.

EXAMPLE 8

Preparation of Sulfonamide Terpolymer

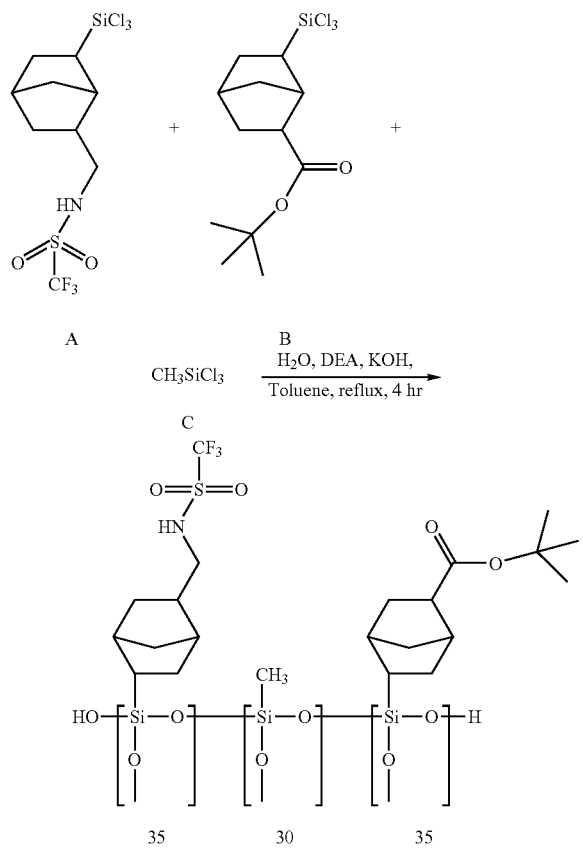

To a 250 ml 3 necked Rb flask fitted with a thermometer and an addition funnel, gas inlet was added the solution of DEA (13.1 g), DI water (19.7 g) and toluene (20 ml). The flask temperature was between 0 to −5° C. To this chill solution was added a mixture of the monomers (8.1 g of A; 6.84 g of B and 2.66 g of C) and toluene (40 g) drop wise over a period of 55 min. (Note: at 0° C., there were three phases: an aqueous bottom layer, a clear toluene top layer and a gummy material). After the addition was complete the whole mixture was allowed to come to RT and stirred for additional 2 hr. The toluene and the water layer were separated in a separating funnel and the toluene layer was further washed thrice with DI-+water and transferred to the RB flask that contains the gummy material. Dichloromethane was added into this mixture until get a clear solution.

The toluene/dichloromethane mixture from above work-up was added into a 250 ml 3 necked RB flask (total solution was ~200 ml) fitted with a thermometer, Dean-Stark trap and a condenser. Dichloromethane was distilled off completely by heating the whole solution and 4.2 g of 25% of Tetrabutylammonium hydroxide (TBAH) solution was added drop wise at 110° C. The mixture was heated to reflux to azeotrope water that was added along with TBAH. The reflux was continued for 4 hr. After 4 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight.

EXAMPLE 9

Photoresist Preparation and Lithographic Processing (Darkfield Formulation)

The following process was performed under yellow light.

A solution of resist formulation was prepared by dissolving 1.73 g of NBMe/NBt-Bu/NBSAM (30/35/35) silsesquioxane terpolymer as prepared in Example 8 above, 0.082 g triphenylsulfonium perfluorobutanesulfonate, 0.013 g Troeger's base and 0.002 g of surfactant in 17.9 g 2-heptanone. The resulting solution was filtered through a 0.1 micron Teflon filter. Using a TEL ACT 8 Coater/Developer Track, the resist was coated onto 8 inch Si wafers, which had been coated with 510 nm of an appropriate underlayer, and baked at 90° C. for 60 sec to form a resist film with a thickness of 150 nm. The coated wafers were then exposed through a mask pattern using an ASM PAS 5500/1100 193 nm scanner. The exposed wafers were then baked at 90° C. for 120 sec and subsequently developed for 60 sec at 20° C. using a 0.26N aqueous alkaline developer solution. Finally, the wafers were rinsed with deionized water and dried. Extremely good focus latitude of this photoresist for 90 nm contact holes was obtained.

EXAMPLE 10

Photoresist Preparation and Lithographic Processing (Brightfield Formulation)

The following process was performed under yellow light.

A solution of resist formulation was prepared by dissolving 1.587 g of NBMe/NBt-Bu/NBSAM (30/35/35) silsesquioxane terpolymer as prepared in Example 8 above, 0.050 g triphenylsulfonium perfluorobutanesulfonate, 0.012 g Troeger's base and 0.002 g of surfactant in 13.35 g 2-heptanone. The resulting solution was filtered through a 0.1 micron Teflon filter. Using a TEL ACT 8 Coater/Developer Track, the resist was coated onto 8 inch Si wafers, which had been coated with 510 nm of an appropriate underlayer, and baked at 110° C. for 60 sec to form a resist film with a thickness of 150 nm. The coated wafers were then exposed through a mask pattern using an ASM PAS 5500/1100 193 nm scanner. The exposed wafers were then baked at 110° C. for 60 sec and subsequently developed for 60 sec at 20° C. using a 0.26N aqueous alkaline developer solution. Finally, the wafers were rinsed with deionized water and dried. Inspection of the wafers showed that the formulation is capable of resolving 80 nm lines:spaces.

The foregoing description of the invention is merely illustrative thereof, and it is understood that variations and modifications can be made as set forth in the following claims.

What is claimed is:

1. A positive photoimageable composition comprising:
   one or more photoacid generator compounds;
   at least one polymer that is a silsesquioxane and comprises at least three distinct repeat units, wherein one or more repeat units comprise one or more photoacid labile groups;
   and the polymer or one or more other components comprises one or more Si atoms and one or more sulfonamide groups.

2. The photoimageable composition of claim 1 wherein the polymer comprises one or more Si atoms and one or more sulfonamide groups.

3. The photoimageable composition of claim 1 wherein the polymer comprises aromatic groups.

4. The photoimageable composition of claim 1 wherein the polymer is at least substantially free of aromatic groups.

5. A method for forming a electronic device, comprising:
   (a) applying on a substrate a coating layer of a polymer composition;
   (b) above the polymer composition coating layer, applying a photoimageable composition of claim 1;
   (c) exposing the photoimageable composition coating layer to activating radiation and developing the exposed photoimageable layer.

* * * * *